(12) United States Patent
Peeren et al.

(10) Patent No.: US 11,365,637 B2
(45) Date of Patent: Jun. 21, 2022

(54) METHOD FOR PROFILING BLADES OF AN AXIAL TURBOMACHINE

(71) Applicant: Siemens Energy Global GmbH & Co. KG, Munich (DE)

(72) Inventors: Christian Peeren, Berlin (DE); Stefan Schmitt, Mülheim an der Ruhr (DE); Heinrich Stüer, Haltern (DE)

(73) Assignee: Siemens Energy Global GmbH & Co. KG, Munich (DE)

( * ) Notice: Subject to any disclaimer, the term of this patent is extended or adjusted under 35 U.S.C. 154(b) by 711 days.

(21) Appl. No.: 16/093,312

(22) PCT Filed: Apr. 12, 2017

(86) PCT No.: PCT/EP2017/058776
§ 371 (c)(1),
(2) Date: Oct. 12, 2018

(87) PCT Pub. No.: WO2017/186492
PCT Pub. Date: Nov. 2, 2017

(65) Prior Publication Data
US 2019/0203601 A1 Jul. 4, 2019

(30) Foreign Application Priority Data
Apr. 27, 2016 (EP) .................................. 16167260

(51) Int. Cl.
*F01D 5/16* (2006.01)
*F01D 5/14* (2006.01)
(Continued)

(52) U.S. Cl.
CPC ............... *F01D 5/16* (2013.01); *F01D 5/141* (2013.01); *F04D 27/001* (2013.01);
(Continued)

(58) Field of Classification Search
CPC ........ F04D 29/667; F04D 29/324; F01D 5/16; F05D 2260/96
See application file for complete search history.

(56) References Cited

U.S. PATENT DOCUMENTS

| | | | |
|---|---|---|---|
| 5,993,161 A * | 11/1999 | Shapiro | F04D 29/666 416/203 |
| 7,497,664 B2 * | 3/2009 | Walter | F01D 5/141 416/223 A |

(Continued)

FOREIGN PATENT DOCUMENTS

| | | |
|---|---|---|
| EP | 1528223 A2 | 5/2005 |
| JP | 2003056486 A | 2/2003 |
| JP | 2012007612 A | 1/2012 |

OTHER PUBLICATIONS

International Search Report and Written Opinion dated Jul. 11, 2017, for corresponding PCT/EP2017/058776.
(Continued)

*Primary Examiner* — Jacob J Cigna
*Assistant Examiner* — Michael W Hotchkiss

(57) ABSTRACT

A method for profiling blades of an axial turbomachine includes preparing a geometric model of a blade profile; determining an oscillation mode of the geometric model; calculating a time profile of a position-dependent disruptive pressure in a channel between two adjacent blade profiles over an oscillation period of the oscillation belonging to the oscillation mode, changing the geometric model and determining a different oscillation mode for the modified geometric model; and determining the damping of the oscillation using the disruptive pressure profile calculated previously and accepting the modified geometric model for the case that the damping of the oscillation turns out to be (Continued)

greater than calculated, otherwise repeating the last two steps with another modified geometric model.

10 Claims, 3 Drawing Sheets

(51) Int. Cl.
*F04D 27/00* (2006.01)
*F04D 29/32* (2006.01)
*F04D 29/66* (2006.01)
*G06F 30/17* (2020.01)
*G06F 30/23* (2020.01)

(52) U.S. Cl.
CPC ......... *F04D 29/324* (2013.01); *F04D 29/667* (2013.01); *F04D 29/668* (2013.01); *G06F 30/17* (2020.01); *G06F 30/23* (2020.01); *F05D 2250/70* (2013.01); *F05D 2260/81* (2013.01); *F05D 2260/96* (2013.01); *G05B 2219/35151* (2013.01)

(56) References Cited

U.S. PATENT DOCUMENTS

| | | | |
|---|---|---|---|
| 7,909,580 B2 * | 3/2011 | Simpson | F01D 5/16 416/223 A |
| 8,135,568 B2 | 3/2012 | Pandey et al. | |
| 8,375,698 B2 * | 2/2013 | Lombard | F01D 5/142 60/204 |
| 9,835,034 B2 * | 12/2017 | Gronsfelder | F01D 5/16 |
| 9,879,539 B2 * | 1/2018 | Lentz | F01D 5/16 |
| 9,963,974 B2 * | 5/2018 | Duong | F01D 5/16 |
| 9,970,456 B2 * | 5/2018 | Japikse | F01D 25/24 |
| 10,563,511 B2 * | 2/2020 | Peeren | F01D 5/141 |
| 2005/0096891 A1 | 5/2005 | Simpson et al. | |
| 2006/0275134 A1 * | 12/2006 | Hasenjager | F01D 5/141 416/237 |
| 2008/0014091 A1 * | 1/2008 | Gentile | F01D 5/16 416/223 R |
| 2009/0155082 A1 * | 6/2009 | Duong | F01D 5/005 416/223 A |
| 2010/0050594 A1 * | 3/2010 | Lombard | F01D 5/16 60/204 |
| 2011/0202321 A1 * | 8/2011 | Lung | B64C 3/14 703/1 |
| 2011/0206527 A1 * | 8/2011 | Harvey | F04D 29/681 416/223 R |
| 2014/0112760 A1 | 4/2014 | Duong et al. | |
| 2014/0348648 A1 * | 11/2014 | Hield | G06F 30/23 415/208.1 |
| 2015/0152880 A1 * | 6/2015 | Reiss | F04D 29/388 416/229 A |
| 2016/0061042 A1 * | 3/2016 | Duong | F01D 5/145 416/243 |
| 2018/0100399 A1 * | 4/2018 | Peeren | F04D 29/324 |

OTHER PUBLICATIONS

EP search report dated Nov. 8, 2016, for corresponding EP patent application No. 16167260.5.

* cited by examiner

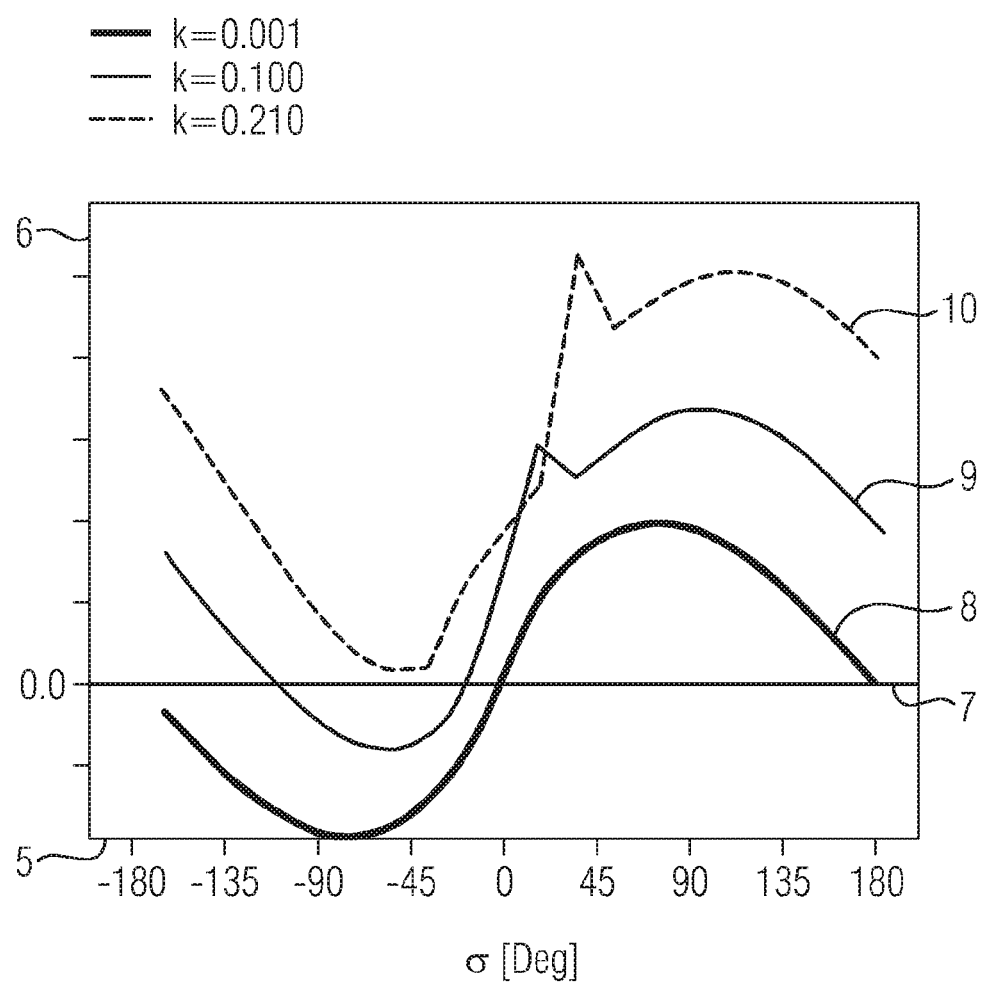

METHOD FOR PROFILING BLADES OF AN AXIAL TURBOMACHINE

CROSS REFERENCE TO RELATED APPLICATIONS

This application is the US National Stage of International Application No. PCT/EP2017/058776 filed Apr. 12, 2017, and claims the benefit thereof. The International Application claims the benefit of European Application No. EP16167260 filed Apr. 27, 2016. All of the applications are incorporated by reference herein in their entirety.

FIELD OF INVENTION

The invention relates to a method for profiling blades of an axial turbomachine.

BACKGROUND OF INVENTION

The trend in the design of blades for an axial turbomachine is towards increasing the aspect ratio of the blades and making the blades thinner. The blades designed in this way tend to flutter when the axial turbomachine is operating. The fluttering is a self-excited oscillation at the natural frequency of the blade. This oscillation can be a longitudinal oscillation of the blade with an oscillation node at the foot of the blade. Energy is transferred here from the fluid flowing in the axial turbomachine to the blade. The fluttering can lead to material fatigue of the blade (high -cycle fatigue) through a repeated change in the load of the axial turbomachine. The material fatigue can lead to the formation of a crack, and make an expensive exchange of the blade necessary.

The fluttering is conventionally prevented in that the load acting on the blade is minimized. Disadvantageously however this leads to a reduction in the efficiency of the axial turbomachine. Damping elements are also conventionally provided, such as, for example, a cover band, which damps the fluttering of the blades. This, however, represents a constructively elaborate solution. It would therefore be desirable to design the blade in such a way that it does not tend to flutter when the axial turbomachine is operating.

The blade is conventionally designed in that a blade profile is first evaluated, in a preliminary design process, from the point of view of the reduced frequency and of the OD Strouhal criterion. After the preliminary design process the accepted blade profile is evaluated in an extensive numerical oscillation simulation. The accepted blade profiles, evaluated on the basis of the reduced frequency and of the Strouhal criterion, often however exhibit an unacceptable flutter behavior in the oscillation simulation. This has the result that, for many different blade profiles, the preliminary design process and the numerical oscillation simulation have to be repeated, which is time-consuming and expensive.

SUMMARY OF INVENTION

An object of the invention therefore is to create a method for profiling a blade of an axial turbomachine that is less time-consuming and less expensive.

A method according to the invention for profiling blades of an axial turbomachine has the steps of: a) preparing a geometric model of a blade profile; b) determining an oscillation mode of the geometric model; c) calculating a time profile of a position-dependent disruptive pressure $p(\vec{x}, t) = p_{ges}(\vec{x}, t) - p_0(\vec{x})$ in a channel between two adjacent blade profiles over an oscillation period of the oscillation belonging to the oscillation mode, wherein in order to calculate the profile it is assumed that the position-dependent disruptive pressure $p(\vec{x}, t)$ in the channel is proportional to the magnitude of a surface $A(\vec{x}, t)$) which extends in the channel and is arranged perpendicular to the flow lines between blade surfaces bounding the channel, and perpendicular to these blade surfaces, wherein $\vec{x}$ is a coordinate on one of the two blade surfaces, t is time, $P_0(\vec{x})$ is the position-dependent pressure when the blade profile is stationary, and $p_{ges}(\vec{x}, t)$ is the position-dependent total pressure; d) determining the damping of the vibration caused by the disruptive pressure profile; e) changing the geometric model, as well as determining a different oscillation mode for the modified geometric model as well as carrying out step c) with the modified geometric model, the different oscillation mode; f) determining the damping of the oscillation using the disruptive pressure profile $p(\vec{x}, t)$ calculated in step e) and accepting the modified geometric model for the case that the damping of the oscillation turns out to be greater than in step d), otherwise repeating steps e) and f) with another modified geometric model.

The method requires less computation, in particular as a result of the assumption that the disruptive pressure in the channel is proportional to the surface $A(\vec{x}, t)$. The assumption is valid for infinitely slowly oscillating blade profiles. In spite of this assumption, it was found, surprisingly, that the accepted geometric model showed good damping properties in a subsequent numerical oscillation simulation. It is therefore not necessary to carry out a large number of numerical oscillation simulations. As a result of the reduced computation required by the method, and the low number of numerical oscillation simulations to be carried out, the method is advantageously less time-consuming and less expensive.

Advantageously, the method comprises the step of: g) numerically calculating the oscillation, engendered by a flow, of the geometric model accepted in step f) and calculating the damping of the oscillation. The method step g) involves the numerical oscillation simulation referred to above. The damping of the oscillation calculated here is more accurate than that determined in method step d). It is advantageous here that the convection and the inertia of the flow are taken into account in step g). The accuracy in the determination of the damping can thereby be increased yet further.

It is advantageous that the oscillation mode $\vec{a}_c$ and $\vec{a}_s$ are local deformations. It is advantageous here for $\vec{a}_c$ and $\vec{a}_s$ to be prepared by means of a finite element structure solver.

It is advantageous for $A(\vec{x}, t)$ to be illustrated according to $A(\vec{x}, t) = A_0(\vec{x}) + \mathrm{Re}[(\hat{A}_1 e^{i\beta_1} e^{i\sigma} + \hat{A}_R e^{i\beta_R}) e^{i\omega t}]$, wherein $A_0(\vec{x}(x))$ is the area $A(\vec{x}, t)$ when the blade profiles are stationary, $\hat{A}_R = |\vec{n}_R \cdot \vec{\phi}|_R$ is the projection of the oscillation mode onto the normal $\vec{n}_R$ to the blade surface at the coordinate $\vec{x}$ for the one blade profile, $\hat{A}_1 = |\vec{n}_1 \cdot \vec{\phi}|_1$ is the projection of the oscillation mode onto the normal $\vec{n}_1$ to the blade surface at a point on the blade surface of the other blade profile, $\beta_1$ and $\beta_R$ are the respective phase offset between the imaginary component and the real component, σ is the phase offset of the oscillations of the two blade profiles, and ω is the angular frequency. This includes the approximation that the blade profile moves perpendicularly to its blade surface during the oscillation. This approximation is applicable in particular for small deflections of the blade during its oscillation. The method advantageously requires less computation as a result of this approximation. In spite of this approximation, the accepted geometric model advantageously has good damping properties.

It is advantageous if $A_0(\vec{x})$ is determined in that a circle is found on the blade surface of the one blade profile at the coordinate $\vec{x}$ which is tangential to the blade surface of the one blade profile at the coordinate $\vec{x}$ and the blade surface of the other blade profile at the point, and $A_0)$ $(\vec{x})$ is selected in such a way that $A A_0(\vec{x})$ is tangential to the normal $\vec{n}_R$ at the coordinate $\vec{x}$ and by the normal $\vec{n}_1$ at that point. This advantageously represents a simple method step for determining the surface $A_0(\vec{x})$. Together with the assumption that the blade profiles move normally to the blade surface during the oscillation, the temporal change of the surface $A_0(\vec{x}, t)$ is accurately defined. $A_0(\vec{x})$ is advantageously determined through an interpolation of a function, in particular a second-order polynomial, between the coordinate $\vec{x}$ and the point. This represents a particularly simple method step for determining the surface $A_0(\vec{x})$. It is, for example, not necessary to carry out a flow simulation to determine the flow lines. In spite of this simple method for determining the surface $A_0(\vec{x})$, the accepted geometric model advantageously has good damping properties.

It is advantageous that in step d) the damping of the oscillation is determined for different values of $\beta_1$, $\beta_R$ and σ. The time-dependency of the surface $A_0(\vec{x}, t)$ can thereby be determined. It is, furthermore, advantageous for an integration of the position-dependent disruptive pressure along the complete channel to be performed in step d).

BRIEF DESCRIPTION OF THE DRAWINGS

The invention is explained in more detail below with reference to the schematic drawings. Here:

FIG. 5 shows a damping profile over an oscillation period for different reduced frequencies.

DETAILED DESCRIPTION OF INVENTION

Figure 1:
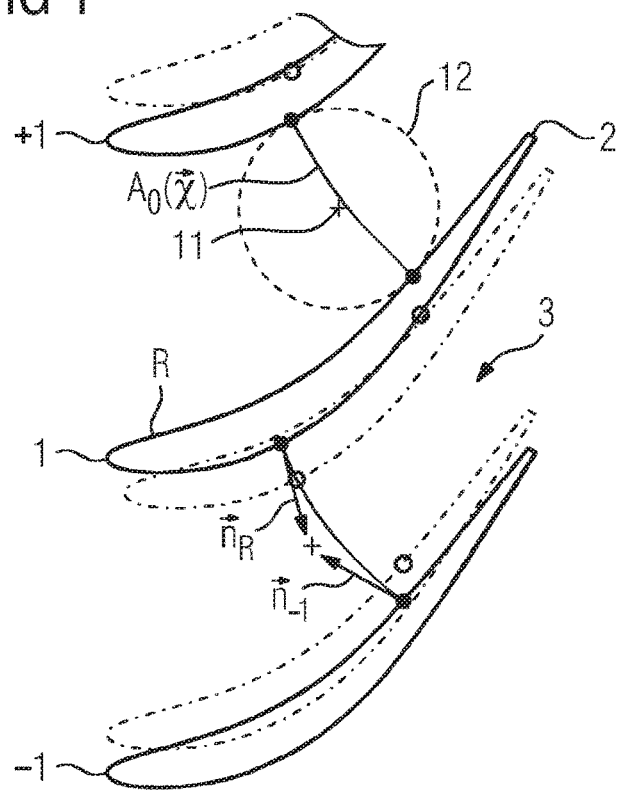
FIG. 1 shows a cross section through three adjacent blades.

An axial turbomachine, such as for example a gas turbine or a steam turbine, comprises arrays of blades. The blades may be guide blades and/or rotor blades which are arranged in a compressor and/or in a turbine. FIG. 1 shows three adjacent, neighboring blades. A geometric model of a blade profile for each of the three blades is illustrated. The middle blade profile is shown as a reference blade profile R, and the two blade profiles neighboring the reference blade profile R are shown as a first neighboring blade profile +1 and as a second neighboring blade profile −1. Each of the blade profiles R, −1, +1 comprises a respective front edge 1 and a rear edge 2. A channel 3 is arranged between each two adjacent blade profiles in which a working fluid flows when the axial turbomachine is operating. The solid lines in FIG. 1 represent the blade profiles R, +1, −1 in their stationary state. The dotted lines represent the oscillation of the blade profiles R, +1, −1, wherein the first neighboring blade profile +1 and the second neighboring blade profile −1 have an identical oscillation phase that is offset from the oscillation phase of the reference blade profile R.

In the method for profiling the blade, in a step a) the geometric model of the blade profile R, −1, +1 is prepared, wherein the blade profiles R, −1, +1 in a row of blades are identical.

Figure 4:
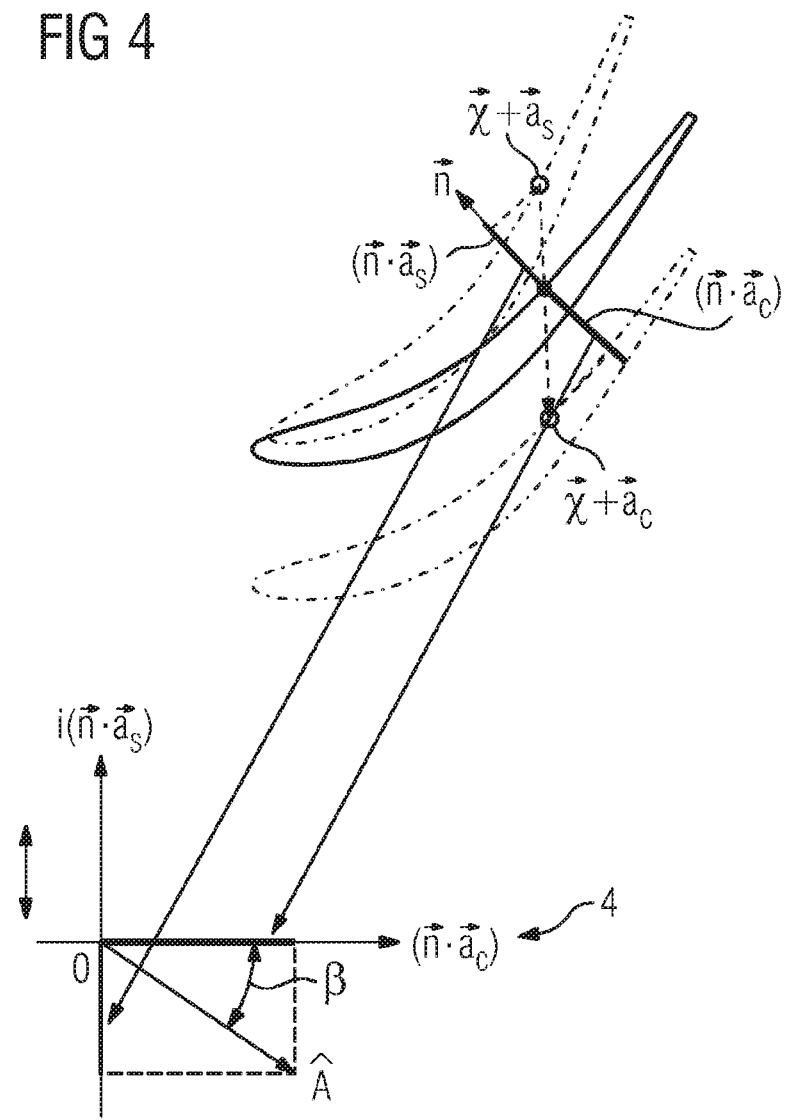
FIG. 4 shows an illustration of an oscillation mode of a blade.

The oscillation mode $\vec{\phi}$ of the geometric model is determined in a step b). As can be seen from FIG. 4, the oscillation mode $\vec{\phi}$ can be represented in complex form according to $\vec{\phi} = \vec{a}_c + i\vec{a}_s$, wherein $\vec{a}_c$ and $\vec{a}_s$ are local deformations. The oscillation mode then results as an overlay of these two modes. This overlay is displayed in FIG. 4 in a vector diagram 4, wherein the phase offset between the real and imaginary components is identified with β. $\vec{a}_c$ and $\vec{a}_s$ can be determined by means of a finite element structure solver, wherein the finite element structure solver receives the blade profile as an input.

A temporal progression of a position-dependent disruptive pressure $p(\vec{x}, t)$ in the channel 3 over an oscillation period of the oscillation belonging to the oscillation mode is calculated in a step c). $\vec{x}$ here is a coordinate on the surface of one of the two adjacent blade profiles, and t is the time. In order to calculate the disruptive pressure $p(\vec{x}, t)$ it is assumed that the position-dependent disruptive pressure $p\vec{x}$, t) in the channel 3 is proportional to the magnitude of a surface $A(\vec{x}, t)$ that extends in the channel and is arranged on the blade surfaces bounding the channel 3, perpendicular to these blade surfaces, and perpendicular to the flow lines in between.

Figure 3:
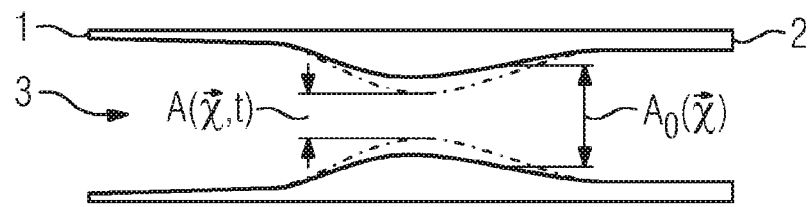
FIG. 3 shows an illustration of a channel between two adjacent blades.

The approximation that the disruptive pressure $p(\vec{x}, t)$ is assumed to be proportional to the surface $A(\vec{x}, t)$ is illustrated in FIG. 3. The solid lines in FIG. 3 represent the two blade surfaces bounding the channel 3 in their stationary state. The dotted lines represent the two blade surfaces that bound the channel 3 with a deflection during their oscillation. With a small area $A(\vec{x}, t)$ the speed of the working fluid when the axial turbomachine is operating is high, whereby a low disruptive pressure $p(\vec{x}, t)$ is found. Conversely, it is similarly true that with a large area $A(\vec{x}, t)$ the speed of the working fluid when the axial turbomachine is operating is low, whereby a high disruptive pressure $p(\vec{x}, t)$ is found.

$A(\vec{x}, t)$ is illustrated according to $A(\vec{x}, t) = A_0(\vec{x}, t) + \text{Re} \lfloor (\hat{A}_1 e^{i\beta_1} e^{i\sigma} + \hat{A}_R e^{i\beta_R}) e^{i\omega t} \rfloor$, wherein $A_0(\vec{x})$ is the surface $A(\vec{x}, t)$ when the blade profile is stationary. As shown in FIG. 1, $A_0(\vec{x})$ can be determined in that a circle 12 is found on the blade surface of the one blade profile at the coordinate $\vec{x}$, which circle is tangential to the blade surface of the one blade profile at the coordinate $\vec{x}$ and the blade surface of the other blade profile at a point. For the case that a plurality of the circles 12 could be found, the circle 12 with the shortest diameter is selected. $A_0(\vec{x})$ is then chosen in such a way that $A_0(\vec{x})$ is tangential to the normal $\vec{n}_R$ to the surface of the one blade profile at the coordinate $\vec{x}$ and to the normal $\vec{n}_1$ to the surface of the other blade profile at the point. $A_0(\vec{x})$ is determined for this purpose by interpolating a function between the coordinate $\vec{x}$ and the point. The function can, for example, be a second-degree polynomial. As can be seen from FIG. 1, both normals $\vec{n}_R$ and $\vec{n}_1$ point towards the circle center 11 of the circle 12, which is a consequence of the fact that the circle 12 is tangential to the two blade surfaces at the coordinate $\vec{x}$ and the point.

Figure 2:
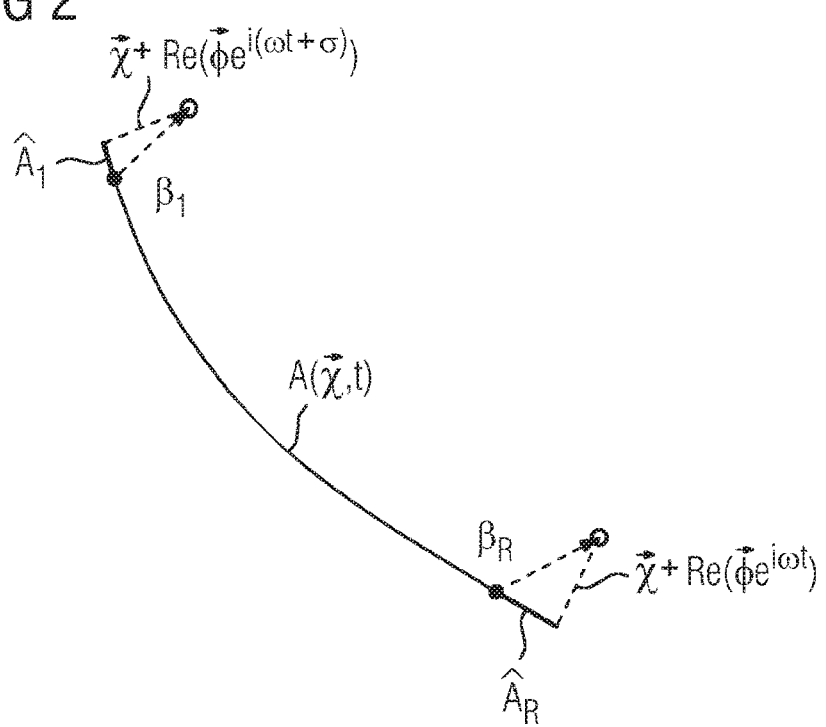
FIG. 2 shows a detail from FIG. 1.

$\hat{A}_R = |\vec{n}_R \cdot \vec{\phi}|_R$ is the projection of the oscillation mode $\vec{\phi}$ onto the normal $\vec{n}_R$ to the blade surface at the coordinate $\vec{x}$ for the one blade profile. $\hat{A}_1 = |\vec{n}_1 \cdot \vec{\phi}|_1$ is the projection of the oscillation mode $\vec{\phi}$ onto the normal $\vec{n}_1$ to the blade surface at the point on the blade surface of the other blade profile. The respective projections $\hat{A}_R$ and $\hat{A}_1$ are illustrated in FIG. 2 as the lines from the respective point to the respective end of the lines. $\beta_1$ and $\beta_R$ are the respective phase offset between the imaginary component and the real component. $\sigma$ is the phase offset of the oscillations of the two blade profiles, and $\omega$ is the angular frequency.

The damping of the oscillation caused by the disruptive pressure profile is determined in a step d). The disruptive pressure is multiplied for this purpose with the projection of the oscillation mode onto the normal to the blade surface. The product obtained as a result is integrated over the full channel 3, whereby the damping results.

The geometric model is changed in a step e), and a different oscillation mode determined for the changed geometric model. Step c) is also carried out in step e) with the changed geometric model and the different oscillation mode.

The damping of the oscillation due to the disruptive pressure profile $p(\vec{x}, t)$ calculated in step e) is determined in a step f). The changed geometric model is accepted for the case in which the damping of the oscillation is greater than is found in step d), otherwise the steps e) and f) are repeated with another changed geometric model.

In step d) the damping of the oscillation for different values of $\beta_1$, $\beta_R$ and $\sigma$ are determined, so that the time-dependency of the surface $A(\vec{x}, t)$ is obtained.

A numerical calculation of the oscillation, engendered by a flow, of the geometric model accepted in step f) and calculation of the damping of the oscillation take place in a step g).

The disruptive pressure $p(\vec{x}, t)$ calculated in step c) and the damping calculated in step d) represent an approximation for the case in which k->0, where k is the reduced frequency. The reduced frequency can be determined according to $$k = \frac{2 * \Pi * c * f}{U},$$

wherein f is the frequency of the oscillation, c is the chord length of the blade profile, and U is the speed of the working fluid in an axial position of the flow machine in which the front edges 1 of the blade profiles lie. The damping profile over an oscillation period for different reduced frequencies k calculated in step g) is illustrated in FIG. 5. The geometric model on which step g) is based is a geometric model accepted in step f). The phase angle $\sigma$ is plotted on the abscissa 5, and the damping is plotted on the ordinate 6. A zero line 7 of the damping is also drawn on FIG. 5, wherein the negative values for the damping signify an excitation of the oscillation, and positive values of the damping signify a damping of the oscillation.

FIG. 5 shows a damping value profile 8 at k=0.001, a damping value profile 9 at k=0.1 and a damping value profile 10 at k=0.21. Due to its lower reduced frequency, the damping value profile 8 is comparable to that determined in step d). It can be seen that the damping of the oscillation increases with increasingly reduced frequency. The geometric model accepted in step f) thus represents a good starting point for the subsequent numerical simulation of the oscillation.

Although the invention has been more closely illustrated and described in more detail through the preferred exemplary embodiment, the invention is not restricted by the disclosed examples, and other variations can be derived from this by the person skilled in the art without leaving the scope of protection of the invention.

The invention claimed is:

1. A method for profiling blades of an axial turbomachine comprising:
   a) preparing a geometric model of a blade profile (R, −1, +1);
   b) determining an oscillation mode of the geometric model;
   c) calculating a time profile of a position-dependent disruptive pressure $p(\vec{x}, t) = p_{ges}(\vec{x}, t) - p_0(\vec{x})$ in a channel between two adjacent blade profiles over an oscillation period of an oscillation belonging to the oscillation mode, wherein in order to calculate the profile it is assumed that the position-dependent disruptive pressure $p(\vec{x}, t)$ in the channel is proportional to a magnitude of a surface $A(\vec{x}, t)$ which extends in the channel and is arranged perpendicular to the flow lines between blade surfaces bounding the channel, and perpendicular to these blade surfaces, wherein $\vec{x}$ is a coordinate on one of the two blade surfaces, t is time, $p_0(\vec{x})$ is a position-dependent pressure when the blade profile is stationary, and $p_{ges}(\vec{x}, t)$ is a position-dependent total pressure;
   d) determining a damping of an oscillation caused by the position-dependent disruptive;
   e) changing the geometric model and determining a different oscillation mode for the changed geometric model, as well as carrying out step c) with the changed geometric model and the different oscillation mode; and
   f) determining a damping of an oscillation using the disruptive pressure profile $p(\vec{x}, t)$ calculated in step e) and accepting the changed geometric model for the case that the damping of the oscillation turns out to be greater than damping of the oscillationin step d), otherwise repeating steps e) and f) with another changed geometric model.

2. The method as claimed in claim 1,
wherein an integration of the position-dependent disruptive pressure is performed in step d) along the complete channel.

3. The method as claimed in claim 1, further comprising:
g) numerically calculating an oscillation, engendered by a flow, of the geometric model accepted in step f) and calculating the damping of an oscillation.

4. The method as claimed in claim 3,
wherein a convection and an inertia of the flow are taken into account in step g).

5. The method as claimed in claim 1,
wherein the oscillation mode is represented in complex form: $\vec{\phi} = \vec{a}_c + i\vec{a}_s$,
wherein $\vec{\phi}$ is the oscillation mode, $\vec{a}_c$ and $\vec{a}_s$ are local deformations.

6. The method as claimed in claim 5,
wherein $\vec{a}_c$ and $\vec{a}_s$ are prepared by means of a finite element structure solver.

7. The method as claimed in claim 5,
wherein $A(\vec{x}, t)$ is illustrated according to $A(\vec{x}, t) = A_0(\vec{x}) + Re[(\hat{A}_1 e^{i\beta_1} e^{i\sigma} + \hat{A}_R e^{i\beta_R}) e^{i\omega t}]$,
wherein $A_0(\vec{x})$ is the area $A(\vec{x}, t)$ when the blade profiles are stationary, $\hat{A}_R = |\vec{n}_R \cdot \vec{\phi}|_R$ is a projection of the oscillation mode onto the normal $\vec{n}_R$ to the blade surface at the coordinate $\vec{x}$ for the one blade profile, $\hat{A}_1 = |\vec{n}_1 \cdot \vec{\phi}|_1$ is a projection of the oscillation mode onto the normal $\vec{n}_1$ to the blade surface at a point on the blade surface of the other blade profile, $\beta_1$ and $\beta_R$ are the relative phase offset between an imaginary component and a real component, $\sigma$ is the phase offset of the oscillations of the two blade profiles, and $\omega$ is the angular frequency.

8. The method as claimed in claim 7,
wherein the damping of the oscillation is determined in step d) for different values of $\beta_1$, $\beta_R$ and $\sigma$.

9. The method as claimed in claim 7,
wherein $A_0(\vec{x})$ is determined in that a circle is found on the blade surface of the one blade profile at the coordinate $\vec{x}$ which is tangential to the blade surface of the one blade profile at the coordinate $\vec{x}$ and the blade surface of the other blade profile at the point, and $A_0(\vec{x})$ is selected in such a way that $A_0(\vec{x})$ is tangential to the normal $\vec{n}_R$ at the coordinate $\vec{x}$ and to the normal $\vec{n}_1$ at that point.

10. The method as claimed in claim 9,
wherein $A_0(\vec{x})$ determined through an interpolation of a function, or through a second-order polynomial, between the coordinate $\vec{x}$ and the point.

\* \* \* \* \*